United States Patent

Buechele et al.

[11] Patent Number: 6,045,615
[45] Date of Patent: Apr. 4, 2000

[54] HOMOGENEOUS SCREENING NOZZLE

[75] Inventors: Alvin W. Buechele, Clinton Corners; John T. Butler, Hopewell Junction, both of N.Y.; Philo B. Hodge, Roxbury, Conn.; David C. Polgrean, Lagrangeville, N.Y.

[73] Assignee: International Business Machines Corporation, Armonk, N.Y.

[21] Appl. No.: 09/014,807

[22] Filed: Jan. 28, 1998

[51] Int. Cl.[7] .................................................. B05C 5/00
[52] U.S. Cl. ..................... 118/300; 118/301; 118/406; 118/410; 118/600
[58] Field of Search ................................ 222/318, 424, 222/478, 586, 572; 239/124–127, 103, DIG. 23; 118/301, 300, 600, 406, 410; 156/578; 427/282

[56] References Cited

U.S. PATENT DOCUMENTS

| | | |
|---|---|---|
| 3,949,667 | 4/1976 | Zimmer . |
| 4,362,486 | 12/1982 | Davis et al. ............................ 425/110 |
| 4,656,048 | 4/1987 | Kudoh et al. . |
| 4,803,110 | 2/1989 | Ahn et al. . |
| 4,938,994 | 7/1990 | Choinski . |
| 5,824,155 | 10/1998 | Ha et al. ................................. 118/406 |

OTHER PUBLICATIONS

IBM Technical Disclosure Bulletin, "Quick change paste dispenser with mixer", vol. 28, No. 2, Jul. 1985 pp. 808–809.

*Primary Examiner*—Laura Edwards
*Attorney, Agent, or Firm*—DeLio & Peterson LLC; John J. Tomaszewski; Aziz M. Ahsan

[57] ABSTRACT

A paste dispensing system for dispensing paste to a substrate such as a ceramic greensheet or other electronic component substrate comprises a reservoir for holding the paste and a nozzle housing in fluid communication with the reservoir and having an opening therein through which the paste is dispensed. The nozzle housing has disposed therein a rotatable slotted shutter which is in fluid communication with the reservoir and which has an auger disposed in the shutter. The auger when actuated, draws paste from the reservoir into the shutter, advances the liquid material through the shutter and circulates the paste back to the reservoir. When it is desired to dispense the paste, the shutter is rotated so that the slot in the shutter communicates with a slot in a nozzle plate connected to the nozzle housing through which slot the paste is dispensed. The paste is continually circulated through the paste dispensing system by the auger whether or not paste is being dispensed. A paste cartridge is also provided for use with the paste dispensing system and is easily attached or removed from the system reservoir avoiding downtime in the paste dispensing operation. A method is also provided for applying a layer of paste to a substrate using the paste dispensing system of the invention.

5 Claims, 3 Drawing Sheets

HOMOGENEOUS SCREENING NOZZLE

BACKGROUND OF THE INVENTION

1. Field of the Invention

This invention relates generally to coating viscous liquid materials onto substrates and, more particularly, to a method and apparatus for screening electrically conductive paste onto ceramic greensheet layers using a paste dispensing system comprising a paste reservoir and a screening nozzle and optionally, a supply cartridge containing the paste which is easily inserted and removed from the system.

2. Description of Related Art

In the manufacture of integrated circuits or printed circuit boards it is often necessary to apply a liquid coating such as a paste to the surface of the substrate. A number of viscous liquid materials are applied to the substrate such as photoresists and electrically conductive pastes and it is important that the liquid material be evenly dispensed to the substrate and that the thickness of the layer be uniform across the surface of the substrate.

One technique for forming layers on a substrate is using a dispensing system comprising a nozzle having an opening through which the paste or other liquid material is dispensed onto the substrate. In general, the nozzle is moved relative to the substrate to form a desired circuit pattern on the substrate. In one method, nozzles produce a direct pattern such as a single line by drawing the nozzle over the surface of the substrate. These processes are typically referred to as nozzle drawing processes. When the nozzle is used in a screening operation, electrically conductive paste or other liquid material is screened onto a ceramic greensheet layer through a mask by drawing the nozzle over the mask surface to provide a desired design on the substrate.

The paste or other coating liquid in the fabrication of a multi-layer ceramic package is generally deaerated. The package is typically made up of as many as 5 to 70 subcomponents (layers) with each of the layers representing a discrete level of wiring in the package. Each layer is basically made up of two materials: a ceramic substrate and a liquid coating material, e.g., molybdenum paste. The ceramic forms the base or substrate and the molybdenum paste is used to personalize or "wire" the layer.

The wiring on each layer comprises interconnection holes known as vias and a distinct wiring pattern on the layer surface. The vias are punched holes in the ceramic sheet that are filled with an electrically conductive material such as molybdenum paste. The vias provide the electrical interconnection in the z direction between the layers and the pattern on the surface transmits signals in the x/y direction of the layer and to the interconnected layers.

The cross-sectional dimensions of the vias and the lines are in the 4 to 6 mil range and it is of critical importance that the feature integrity of the package be maintained. An open/break in a line or via can result in an electrical defect and render the package unusable and it is thus extremely important that the paste or other liquid material be homogeneous, air-free (deaerated) and evenly applied to the substrate and in the vias.

For convenience the following description will be directed to the use of an electrically conductive paste dispensing system in a screening operation using a mask whereby a screening nozzle of the system is contacted with the mask surface and paste forced through the mask to fill vias and signal lines on a ceramic greensheet. It will be understood by those skilled in the art, however, that the paste dispensing system may be used for other liquid coating methods.

Each layer is personalized by means of a paste dispensing system and mask or stencil. The dispensing system comprises a reservoir to hold the paste and a nozzle for the delivery of the paste. The paste is pressurized and flows from the nozzle into and through openings in the mask. The pressure of the paste forces it into the openings in the mask and any corresponding holes in the layer (vias). The assembly is indexed along the mask in order to personalize the entire layer. The holes in the mask define the final pattern on the layer and also ensure all vias are filled.

In the screening operation for ceramic greensheet layers, it is conventional practice to use a paste delivery system comprising a pressurized reservoir holding a specific amount of paste which is sufficient to screen a number of ceramic green sheet layers. The paste is pre-loaded into the reservoir and may be of various formulations and consistencies from a paste to a highly viscous fluid. The paste delivery system is typically stored until it is needed by one of the manufacturing line screeners and the storage of these assemblies can vary from days to weeks. During the storage, the paste homogeneity and its consistency is compromised due to the nature of the paste. The inconsistency of the paste requires frequent visual inspections by the screening operator and leads to interruptions in the screening process.

Another concern with the current state of the art screening operations is that when the reservoir is empty, the assembly must be removed from the tool and replaced with an assembly with a full reservoir. The switching of assemblies thus results in tool down time and operational inefficiencies.

Bearing in mind the problems and deficiencies of the prior art, it is an object of the present invention to provide a method for forming paste and other liquid material patterns (coatings) on substrates such as greensheets and other electronic components using a paste dispensing system whereby the liquid material, e.g., paste, is homogeneous and the system provides uniform coverage of the paste on the substrate.

It is another object of the present invention to provide a paste dispensing system or apparatus to fabricate an electronic component such as an integrated circuit greensheet or printed circuit board using a paste dispensing system in which the paste or other liquid material is maintained in a homogeneous state and the liquid material is evenly and uniformly applied to the substrate.

It is a further object of the invention to provide electronic components such as patterned greensheets made using the paste dispensing system of the invention.

It is an additional object of the present invention to provide a liquid material containing cartridge for use with a liquid material dispensing system which cartridge supplies a fixed amount of liquid material to the system and is then easily replaced with a new cartridge without the downtime associated with conventional dispensing systems.

Other objects and advantages of the present invention will be readily apparent from the following description.

SUMMARY OF THE INVENTION

The above and other objects and advantages, which will be apparent to those skilled in the art, are achieved in the present invention which is directed, in a first aspect, to a paste or viscous liquid material dispensing system for dispensing the paste onto a substrate such as a ceramic greensheet comprising:

a reservoir for holding the paste, the reservoir having at least one opening in the bottom thereof and preferably being open at the bottom thereof;

nozzle means secured to the bottom of the reservoir comprising a nozzle housing having an open bottom and an inlet opening and an outlet opening at opposed upper ends thereof with the inlet and outlet communicating with the reservoir, and a nozzle plate at the base of the nozzle housing having an opening therein communicating during dispensing with the opening at the bottom of the nozzle housing and through which opening the paste is dispensed;

paste moving means such as a screw conveyor or auger within the nozzle housing which recycles paste from the reservoir to the nozzle housing and back to the reservoir by drawing paste from the reservoir through the inlet opening, advancing the paste entering the nozzle housing along the length of the nozzle housing to the outlet of the nozzle housing and forcing the paste back to the reservoir through the outlet opening;

means for communicating the opening in the nozzle plate with the opening in the nozzle housing so that in the open position paste is both recycled and forced through the nozzle plate opening to the substrate and, in a closed, non-communicating position, the paste is only recycled.

In another aspect of the invention, the paste moving means for recycling the paste is an advancing rotatable screw, e.g., auger, which, preferably, runs substantially the length of the nozzle means, e.g., from the inlet to the outlet.

In a further aspect of the invention, the advancing screw is contained within a separately rotatable cylindrical shutter, with the shutter contained within the nozzle housing and having a shutter inlet and shutter outlet at opposed ends thereof communicating with the inlet opening and the outlet opening of the nozzle housing, respectively. The shutter also has a slot along the length thereof which communicates with the opening of the nozzle plate when paste is to be dispensed from the nozzle opening.

In another aspect of the invention, the means for rotating the shutter to dispense paste through the opening of the nozzle plate is air actuated and comprises a linearly movable air actuated rod communicating with the cylindrical shutter which rod when actuated moves linearly and rotates the shutter to align the shutter slot and nozzle opening when paste is to be dispensed from the system or rotates the shutter so that the slot and opening of the nozzle plate are not aligned when no paste is to be dispensed from the system.

In an additional aspect of the invention, the paste dispensing system utilizes a removable paste cartridge which is preferably inserted into and communicates with the reservoir and which contains a fixed amount of paste. The paste is preferably forced from the cartridge into the reservoir by applying pressure such as air pressure to the paste in the cartridge or by a plunger driven by air.

In another aspect of the invention, a method for applying a layer of a paste or other viscous liquid material to a substrate such as a ceramic greensheet comprises the steps of contacting and moving the paste dispensing system of the invention comprising a reservoir and nozzle means along the surface of a mask, stencil or other pattern forming member. During movement of the paste dispensing system, paste is applied to the substrate through an opening in the nozzle means such as a slot in a nozzle plate connected to the nozzle housing. In an alternative embodiment, the paste dispensing system may be maintained stationary with the substrate moving under the nozzle. This method is not preferred however.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
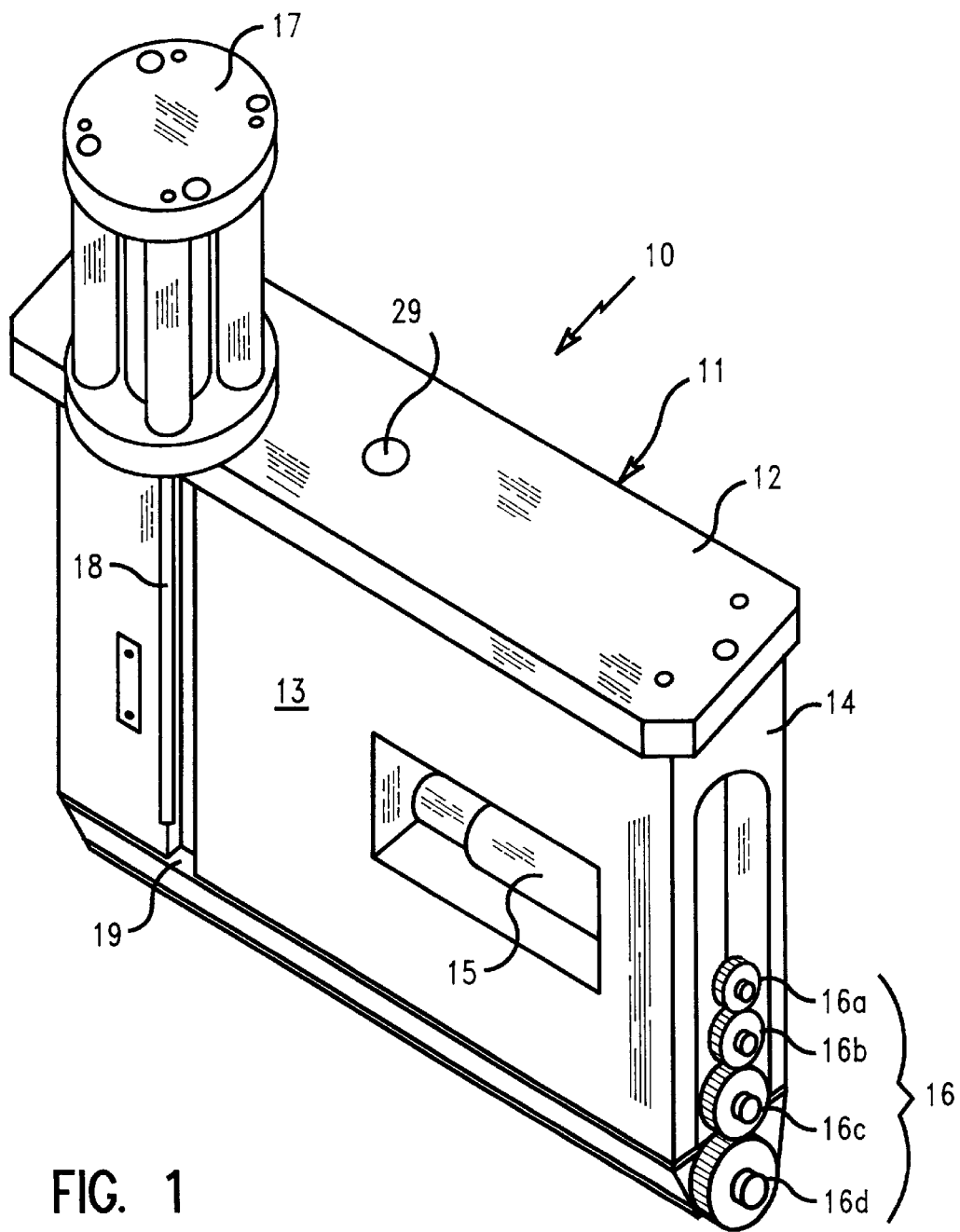
FIG. 1 is a perspective diagrammatic view of a preferred paste dispensing system of the invention.

In describing the preferred embodiments of the present invention, reference will be made herein to FIGS. 1–4 of the drawings in which like numerals refer to like features of the invention. Features of the invention are not necessarily shown to scale in the drawings.

The present invention is used for providing coatings of viscous liquid materials on substrates. In particular, the paste dispensing system will be used to provide coatings such as electrically conductive pastes and photoresists on electronic component substrates such as greensheets.

The liquid materials are typically relatively viscous such as pastes and having a viscosity in the range up to about 700 poise and above, generally about 300 to 600 poise. Typically, the coatings are applied to the substrate in thicknesses of about 0.5 mil to 20 mil. The preferred mode of applying the coating to the substrate is to contact the nozzle plate of the paste dispensing system with the substrate to be coated and to move the system (nozzle plate) over a stationary masked substrate. For coating a metallic paste onto a greensheet, the nozzle will move back and forth over a square 200 mm greensheet in about 4 seconds. The greensheets contain a number of chip layers on each greensheet such as a 5×5 array on a greensheet about 200 mm. square. A paste or nozzle pressure of up to about 20 psig or higher is normally employed. The width of the nozzle plate of the system is about the width of the mask to be screened and for a 200 mm square greensheet is about 200 mm wide.

Referring to FIG. 1, a paste dispensing system of the invention is shown generally as 10. The nozzle assembly 10 comprises an elongated reservoir housing 11 having a top wall 12, a side wall 13, a corresponding opposed side wall (not shown), end wall 14 and opposed end wall (not shown) and an open bottom which will receive the nozzle housing 19. The reservoir housing 11 forms a reservoir having an open bottom for holding the paste or other viscous liquid material to be coated onto a substrate. The open bottom is closed by the nozzle housing except for communicating openings in the nozzle housing as described hereinbelow.

A motor 15 is shown positioned within a cutout area of the reservoir housing 11. The motor 15 drives an auger gear train shown generally as 16 and comprises gears 16a, 16b, 16c and 16d. An air cylinder 17 having a drive rod 18 is mounted on the reservoir housing 11 and is used to rotate a shutter (not shown) which has a slot therein. The slot communicates with a slot in a nozzle plate connected to nozzle housing 19 so that the viscous liquid material can be dispensed from the paste dispensing system 10. The reservoir housing 11 is shown having an opening 29 in top wall 12 which opening is typically threaded and to which a paste or other viscous liquid material containing cartridge can be fixedly secured for supplying the viscous liquid material to the reservoir of the paste dispensing system.

Figure 2:
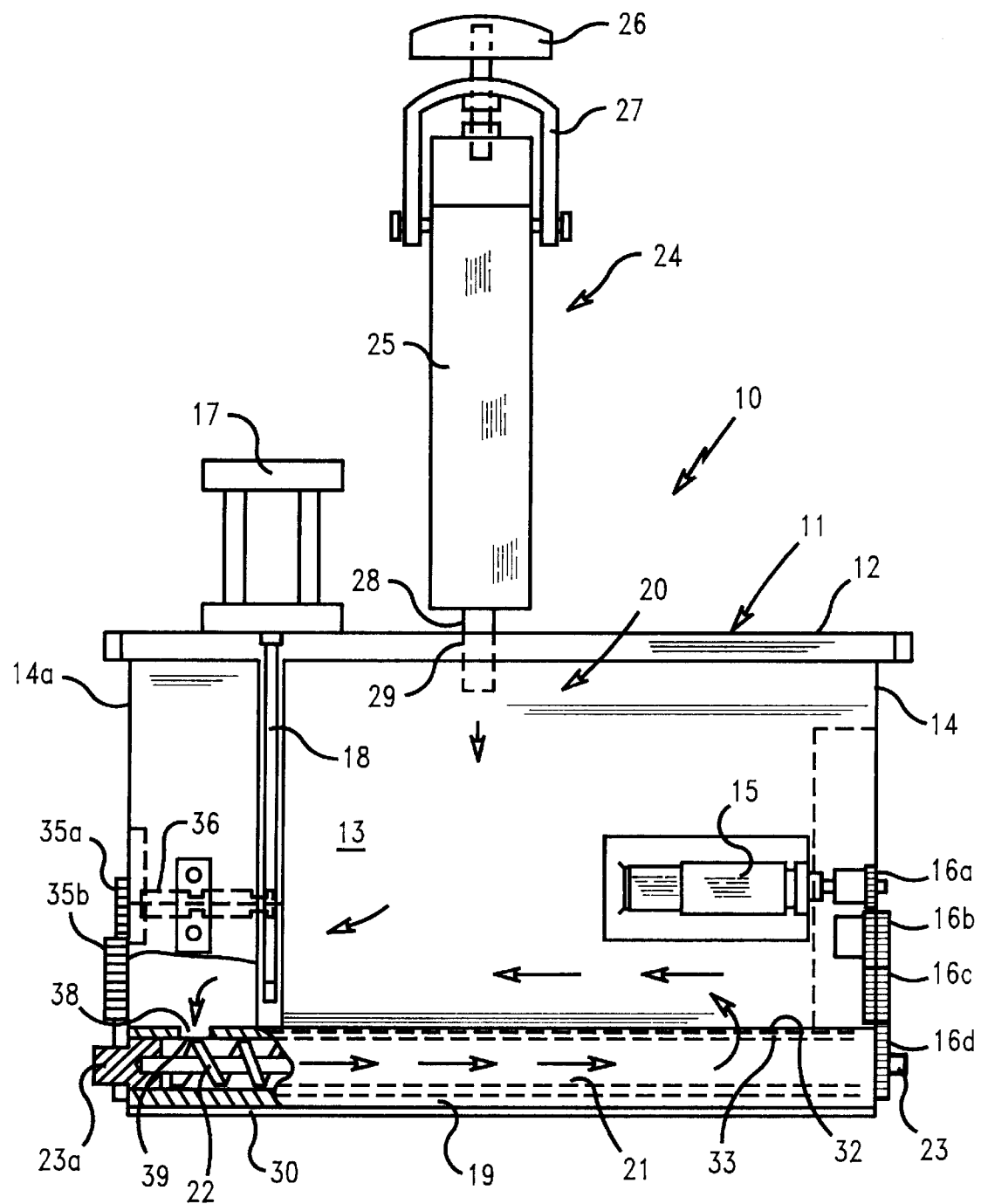
FIG. 2 is a front elevational view of the paste dispensing system of FIG. 1 including a paste cartridge inserted into the reservoir of the system.

Referring now to FIG. 2, a front elevational view of paste dispensing system 10 shows the reservoir housing 11 having a side wall 13, top wall 12 and end walls 14 and 14a. The reservoir housing 11 has an open area 20 therein defined by the walls which provides a reservoir for holding the viscous liquid material (paste) to be dispensed from the paste dispensing system. Motor 15 is shown in a cut-out area of reservoir housing 11 and is connected by a shaft to interconnected gears 16a, 16b, 16c and 16d. Gear 16d is connected to auger 22 so that auger 22 rotates when the motor 15 is energized.

Auger 22 is shown positioned within nozzle shutter 21 which is a cylindrical tube running the length of the nozzle housing 19. As will be shown more fully in FIG. 3, shutter 21 has openings 39 and 33 at the upper surface thereof at opposed ends of the shutter which openings communicate with openings 38 and 32, respectively, in the upper portion of nozzle housing 19. As the auger rotates, the paste or other viscous liquid material in reservoir 20 is drawn in the direction of the arrows and travels from the reservoir 20 through inlet opening 38 in the nozzle housing 19 and communicating opening 39 in the nozzle shutter and advances through the nozzle housing until it exits through shutter opening 33 at the opposed end of the nozzle shutter and a corresponding communicating opening 32 in the nozzle housing. The viscous liquid material is constantly being circulated (recycled) through the nozzle housing 19 and reservoir 20 by being drawn into the shutter, through the shutter and back into the reservoir as shown by the arrows. A nozzle plate 30 is shown attached to the lower surface of nozzle housing 19. Bushing 23 and 23a secure the auger in the nozzle housing 19.

A paste containing cartridge is shown generally as 24. Nozzle 28 of the cartridge is shown inserted into opening 29 of the nozzle assembly and will be typically screwed into or otherwise fixed to top 12 of reservoir housing 11. The paste cartridge 24 comprises a housing 25, generally cylindrical, which housing contains the paste or other viscous liquid material to be fed into the paste dispensing system. In operation, air pressure or other force is applied to a quick disconnect air inlet 26 and exerts pressure on the paste in the cartridge, which pressure pressurizes the cartridge, reservoir and nozzle housing. Handle 27 is used to move the cartridge.

The air cylinder 17 and connected rod 18 are shown communicating with a gear assembly 35a and 35b by connecting rod 36. Thus, as rod 18 is moved vertically up and down by air cylinder 17 connecting rod 36 rotates gears 35a and 35b which in turn rotate shutter 21 which is connected to gear 35b. Rotation of shutter 21 will move a slot in the shutter relative to an opening in the nozzle plate 30 thereby allowing paste or other liquid material to be dispensed through the nozzle plate opening when the shutter slot is aligned with the nozzle opening. This will be further described in FIGS. 3 and 4.

Figure 3:
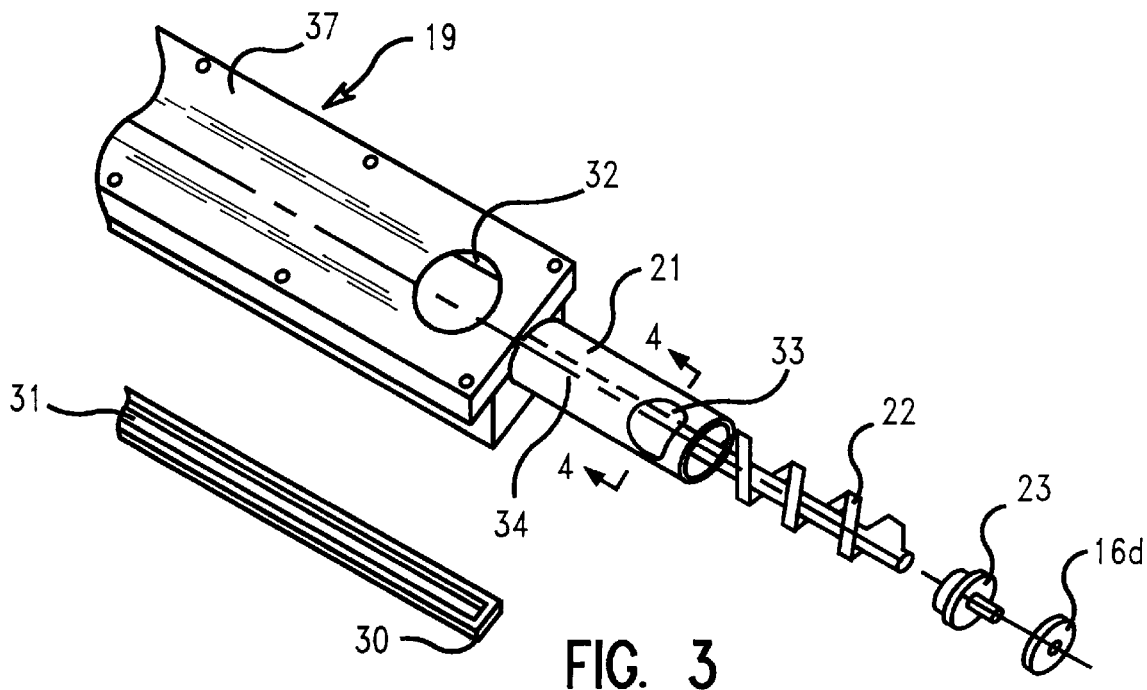
FIG. 3 is a partial exploded view of the nozzle of the paste dispensing system showing the nozzle housing, dispensing control shutter, an auger and a slotted nozzle plate.
Figure 4:
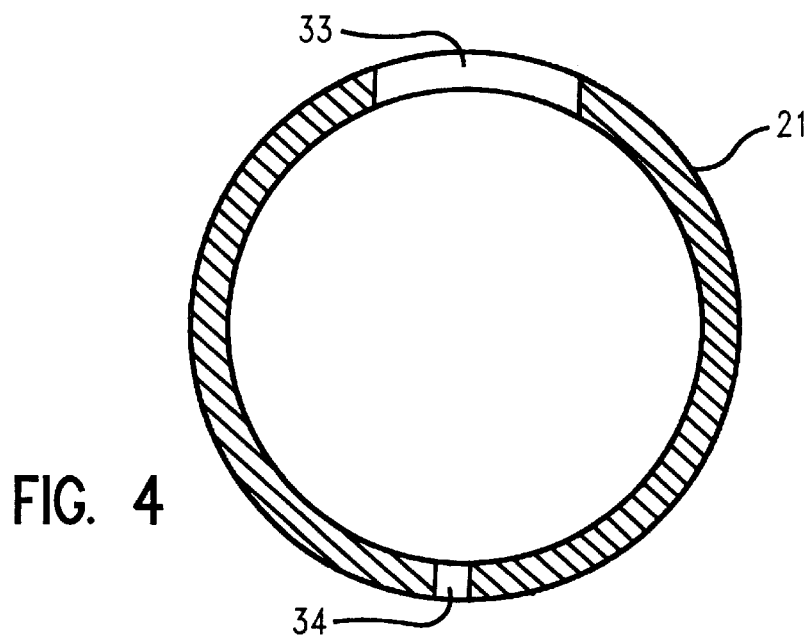
FIG. 4 is a cross sectional view along lines 4—4 of the shutter shown in FIG. 3.

Referring now to FIGS. 3 and 4, a nozzle housing 19 is shown as an elongated rectangular member having an axial opening therethrough to receive rotatable nozzle shutter 21. The top plate 37 of nozzle housing 19 has an opening 32 therein. The nozzle housing will also have another such opening at the opposed end (shown as 38 in FIG. 2).

Opening 32 of nozzle housing 19 communicates with opening 33 of nozzle shutter 21 and (not shown) nozzle housing opening 38 communicates with opening 39 of nozzle shutter 21 (see FIG. 2). The auger 22 is shown disposed within nozzle shutter 21 and is maintained in nozzle shutter 21 and nozzle housing 19 by a fluid tight bushing 23. The auger is driven by gear 16d. A slot 34 is provided in nozzle shutter 21 which slot is opposed to opening 33 and runs substantially the length of the nozzle housing 19. A nozzle plate 30 is secured to the bottom of the nozzle housing 19 and has a slot opening 31 therein running substantially the length of nozzle housing 19. The nozzle plate 30 is typically made of rubber or other elastomer to provide a fluid tight seal between the nozzle plate 30 and the surface of the mask which are in contact during the paste dispensing operation.

Referring to FIG. 4, the nozzle shutter 21 of the invention is shown as being cylindrical and having opening 33 at the top thereof and slot opening 34 at the bottom thereof. In operation, opening 32 of nozzle housing 19 communicates with opening 33 of nozzle shutter 21. These openings and corresponding openings 38 and 39 are always in communication regardless of whether or not paste is being dispensed through the nozzle slot 31. When paste is not being dispensed from the nozzle slot 31, slot 34 of shutter 21 is not in communication with slot 31 of nozzle plate 30. However, openings 32 and 33 (and 38 and 39) are in communication so that when the auger 22 is rotating, paste or other viscous liquid material is drawn into and advanced along and through shutter assemble 21 and exits at openings 33 and communicating opening 32 into reservoir 20 of reservoir housing 11. Simultaneously, as paste or other liquid material is being forced from the shutter 21 by auger 22 the paste or other liquid material is being drawn into shutter 21 through corresponding inlet openings 38 and 39 (shown in FIG. 2) at the opposed ends of nozzle housing 19 and nozzle shutter 21. Thus, the paste or other liquid material is being continually circulated through the nozzle housing 19, nozzle shutter 21 and reservoir 20 as the auger 22 is rotating. Referring to FIG. 2, when it is desired to dispense paste through the nozzle slot 34, the air cylinder 17 is actuated moving rod 18 which in turn rotates gears 35a and 35b rotating shutter assembly 21. The rotation of nozzle shutter 21 is continued until shutter slot 34 communicates with nozzle slot 31. Typically about a 30° rotation. When the shutter slot 34 and nozzle slot 31 are in communication, the paste is forced through shutter slot 34 and nozzle plate slot 31 onto the substrate to be coated. While such paste is being dispensed from the nozzle, the paste is also continually being circulated through the paste dispensing system by advancement of the paste through nozzle shutter 21 into reservoir 20 with paste also being drawn into shutter 21 from the reservoir 20. Thus, whether or not paste is being dispensed from the nozzle, the paste is continually being circulated throughout the assembly when the auger is actuated. This is an important feature of the invention and provides a homogeneous paste and uniform screening process.

Various embodiments with the present invention will now be illustrated by reference to the following specific example. It is to be understood, however, that such example is presented for purposes of illustration only, and the present invention is no way to be deemed as limited thereby.

Using a nozzle assembly as shown in the figures, a paste of molybdenum, copper or tungsten having a viscosity of about 300 to 600 poise are extruded from the assembly through a nozzle plate slot of about 90 mil to 180 mil width onto a greensheet. The nozzle length is about 200 mm. The coating thickness ranged from about 0.5 mil to 20 mil thick.

In another embodiment of the invention, a second auger is employed in the reservoir to move or advance the liquid material in the reservoir in an opposite direction from the direction the paste is moved by the first auger. The additional auger provides enhanced paste circulation and improved paste coating. Referring to FIG. 1, gear 16c would be used to rotate the second auger.

The paste dispensing system 10 of the invention preferably has pressure on the paste or other viscous liquid material in the reservoir 20 so that the paste is forced into the inlet openings 38 and 39, respectively of nozzle housing 19 and shutter 21. The pressure is applied by maintaining a pressure force in reservoir 20. In a preferred embodiment, the pressure is applied by the use of paste cartridge 24 which supplies paste to the reservoir and which paste is under pressure in the paste cartridge 24. Thus, the reservoir 20 is full and the paste cartridge has at least some paste in housing 25 which is under pressure. When the paste is depleted in paste cartridge 24 the cartridge is removed and another cartridge is inserted. Thus, the reservoir 20 in the paste dispensing system 10 is full even when the cartridge is empty and then removed. The reservoir is full but the pressure is lost during the cartridge change until a new cartridge is inserted which may be done quickly with no effect on the dispensing operation.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A paste or viscous liquid material dispensing system for dispensing the paste onto a ceramic greensheet substrate comprising:

a reservoir for holding the paste, the reservoir having at least one opening in the bottom thereof;

nozzle means secured to the bottom of the reservoir comprising a nozzle housing having an open bottom and an inlet opening and an outlet opening at opposed upper ends thereof with the inlet and outlet openings communicating with the reservoir, and a nozzle plate at the base of the nozzle housing having a nozzle plate opening therein communicating during dispensing with the opening at the bottom of the nozzle housing and through which nozzle plate opening the paste is dispensed onto a greensheet substrate;

paste moving means within the nozzle housing which recycles paste from the reservoir to the nozzle housing and back to the reservoir by drawing paste from the reservoir through the inlet opening into the nozzle housing, advancing the paste entering the nozzle housing along the length of the nozzle housing to the outlet of the nozzle housing and forcing the paste back to the reservoir through the outlet opening;

means for communicating the nozzle plate opening with the opening in the nozzle housing so that in the open position the nozzle plate opening and the opening in the nozzle housing are in communication and paste is both recycled to the reservoir through the nozzle housing outlet and forced through the nozzle plate opening to the substrate and, in a closed, non-communicating position, the paste is only recycled.

2. A paste or viscous liquid material dispensing system for dispensing the paste onto a ceramic greensheet substrate comprising:

a reservoir for holding the paste, the reservoir having at least one opening in the bottom thereof;

nozzle means secured to the bottom of the reservoir comprising a nozzle housing having an open bottom and an inlet opening and an outlet opening at opposed upper ends thereof with the inlet and outlet openings communicating with the reservoir, and a nozzle plate at the base of the nozzle housing having a nozzle plate opening therein communicating during dispensing with the opening at the bottom of the nozzle housing and through which nozzle plate opening the paste is dispensed onto a greensheet substrate;

a rotatable cylindrical shutter contained within the nozzle housing and having a shutter inlet and shutter outlet at opposed ends thereof communicating with the inlet opening and outlet opening of the nozzle housing, respectively, and a slot which communicates with the nozzle plate opening when paste is to be dispensed from the nozzle plate opening;

paste moving means within the nozzle housing which recycles paste from the reservoir to the nozzle housing and back to the reservoir by drawing paste from the reservoir through the inlet opening into the nozzle housing, advancing the paste entering the nozzle housing along the length of the nozzle housing to the outlet of the nozzle housing and forcing the paste back to the reservoir through the outlet opening;

means for communicating the nozzle plate opening with the opening in the nozzle housing so that in the open position the nozzle plate opening, the slot and the opening in the nozzle housing are in communication and paste is both recycled to the reservoir through the nozzle housing outlet and forced through the nozzle plate opening to the substrate and, in a closed, non-communicating position, the paste is only recycled.

3. The dispensing system of claim 2 wherein the shutter is rotated using air actuated means.

4. The dispensing system of claim 3 wherein the system further comprises a removable paste cartridge which is inserted into and communicates with the reservoir.

5. The dispensing system of claim 4 wherein the paste cartridge is connected to a pressure source for forcing paste from the cartridge into the reservoir.

* * * * *